US009733578B2

United States Patent
Hashimoto et al.

(10) Patent No.: US 9,733,578 B2
(45) Date of Patent: Aug. 15, 2017

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Akihito Hashimoto, Saitama (JP); Satoshi Maruyama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/749,778

(22) Filed: Jun. 25, 2015

(65) Prior Publication Data

US 2015/0378265 A1 Dec. 31, 2015

(30) Foreign Application Priority Data

Jun. 25, 2014 (JP) .................................. 2014-130687

(51) Int. Cl.
*G03B 27/42* (2006.01)
*G03B 27/58* (2006.01)
(Continued)

(52) U.S. Cl.
CPC ........ *G03F 7/70725* (2013.01); *G03F 7/7085* (2013.01); *G03F 7/70775* (2013.01); *G03F 9/7019* (2013.01); *G03F 9/7092* (2013.01)

(58) Field of Classification Search
CPC ............. G03F 7/70725; G03F 7/70775; G03F 7/7085; G03F 7/70716; G03F 7/70625;
(Continued)

(56) References Cited

U.S. PATENT DOCUMENTS 4,780,617 A * 10/1988 Umatate ............... G03F 9/7003
250/548
5,745,242 A * 4/1998 Hata ....................... G03F 9/70
250/559.3
(Continued)

FOREIGN PATENT DOCUMENTS

CN 102540735 A 7/2012
CN 102566338 A 7/2012
JP 2001066111 A 3/2001

OTHER PUBLICATIONS

Office Action issued in Chinese Appln. No. 201510357283.X mailed Jan. 4, 2017. English translation provided.

*Primary Examiner* — Christina Riddle
(74) *Attorney, Agent, or Firm* — Rossi, Kimms & McDowell LLP (57) ABSTRACT

The present invention provides a measurement apparatus that includes a movable stage and measures a position of a mark on the stage, comprising an imaging device including a plurality of pixels arranged at a pitch and imaging the mark, a driving device changing a relative position between the stage and the imaging device, a measurement device measuring the relative position, and a processor obtaining the position of the mark based on a plurality of images respectively obtained by the imaging device at a plurality of relative positions between the stage and the imaging device that are different from each other and associated with the pitch, wherein the processor is configured to obtain, based on a deviation with respect to one of the plurality of relative positions, a target relative position with respect to another of the plurality of relative positions.

12 Claims, 10 Drawing Sheets

(51) Int. Cl.
*G03F 7/20* (2006.01)
*G03F 9/00* (2006.01)

(58) Field of Classification Search
CPC ............. G03F 7/70641; G03F 7/70666; G03F 7/70675; G03F 7/70683; G03F 9/7003; G03F 9/7007; G03F 9/7011; G03F 9/7015; G03F 9/7019; G03F 9/7073; G03F 9/7092
USPC ........... 355/52, 53, 55, 72–77; 356/614–620, 356/622, 399–401; 250/492.1, 492.2, 250/492.22, 493.1, 548
See application file for complete search history.

(56) References Cited

U.S. PATENT DOCUMENTS

| | | | |
|---|---|---|---|
| 2003/0053058 A1* | 3/2003 | Tanaka | G03F 9/7003 356/401 |
| 2009/0220872 A1* | 9/2009 | Oishi | G03F 9/7092 430/30 |
| 2012/0050709 A1* | 3/2012 | Van Der Pasch | 355/67 |

* cited by examiner

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus that measures a position of a mark on a substrate, a lithography apparatus, and a method of manufacturing an article.

Description of the Related Art

A lithography apparatus used to manufacture a semiconductor device or the like needs to measure the position of a mark on a substrate stage (mark provided on a substrate or the substrate stage) with high accuracy in order to position the substrate with high accuracy. The position of the mark is determined based on an image of the mark that is obtained by an imaging device.

An error arising from sampling (so-called sampling error) at the pixel pitch of the image sensor of the imaging device may be generated in measurement of the position of a mark. Japanese Patent Laid-Open No. 2001-66111 proposes a method of reducing a sampling error by using the fact that the sampling error appears in a predetermined period. The method described in Japanese Patent Laid-Open No. 2001-66111 reduces the sampling error by using a plurality of images in which the positions of a mark projected on the image sensor are different from each other depending on the period of the sampling error.

In the method described in Japanese Patent Laid-Open No. 2001-66111, a plurality of images are obtained by imaging a mark on a substrate while changing the position of a stage that holds the substrate. However, the position of the stage upon imaging the mark on the substrate may have a deviation from a target position. Reduction of the sampling error by using a plurality of images may become insufficient unless the movement of the substrate stage is controlled in consideration of this deviation.

SUMMARY OF THE INVENTION

The present invention provides, for example, a technique advantageous in precision with which a position of a mark is measured.

According to one aspect of the present invention, there is provided a measurement apparatus that includes a movable stage and measures a position of a mark on the stage, the apparatus comprising: an imaging device including a plurality of pixels arranged at a pitch and configured to image the mark via the plurality of pixels; a driving device configured to change a relative position between the stage and the imaging device; a measurement device configured to measure the relative position; and a processor configured to obtain the position of the mark based on a plurality of images respectively obtained by the imaging device at a plurality of relative positions between the stage and the imaging device that are different from each other and associated with the pitch, wherein the processor is configured to obtain, based on a deviation with respect to one of the plurality of relative positions, a target relative position with respect to another of the plurality of relative positions.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. The following embodiments will explain a step & scan type exposure apparatus (so-called scanner) that exposes a substrate while scanning it, but the present invention is not limited to this. The present invention is also applicable to another lithography apparatus such as a step & repeat type exposure apparatus (so-called stepper), an imprint apparatus, or a drawing apparatus.

First Embodiment

[Apparatus Arrangement]

Figure 1:
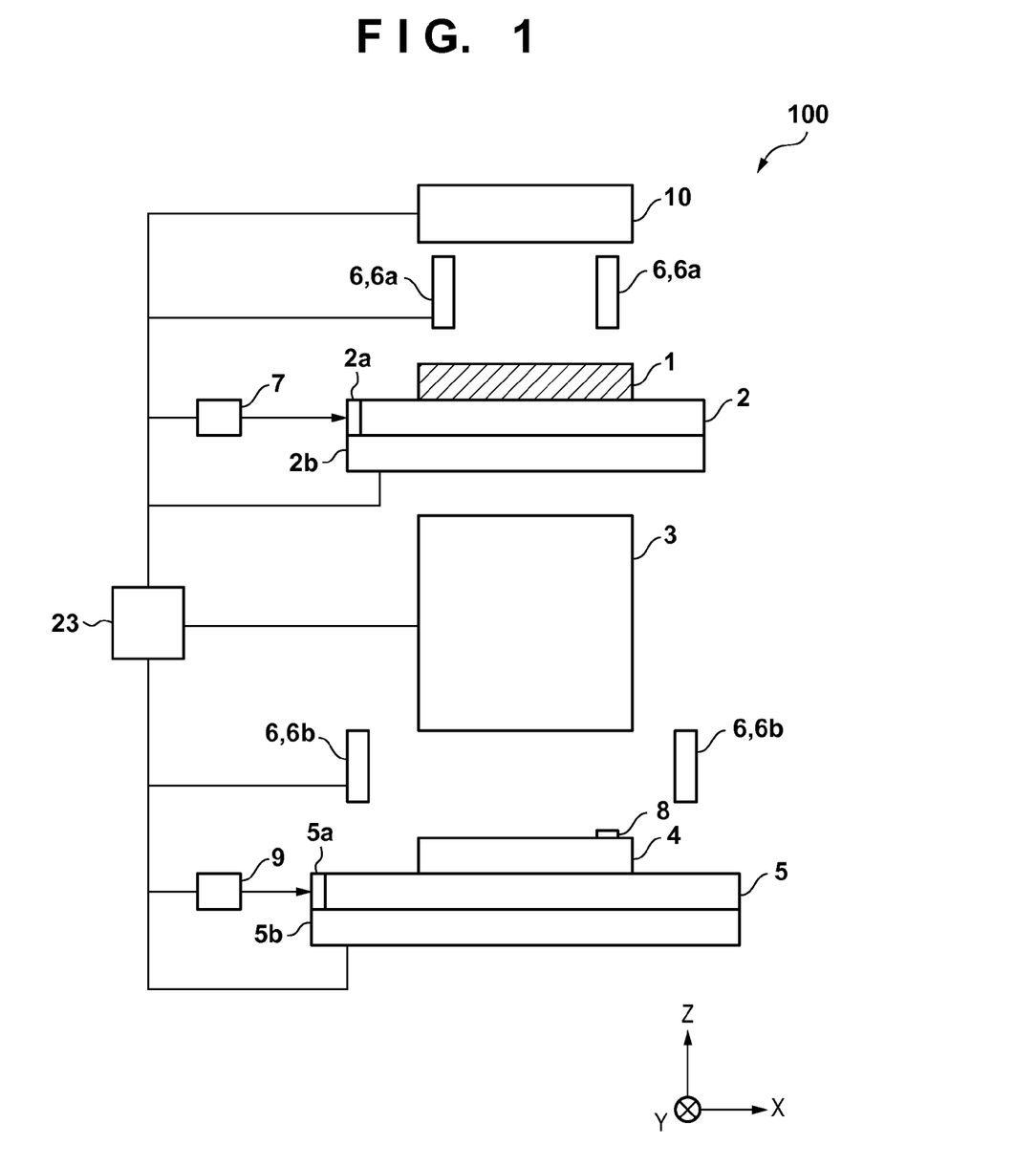
FIG. 1 is a schematic view showing the arrangement of an exposure apparatus according to the first embodiment.

An exposure apparatus 100 according to the first embodiment of the present invention will be explained with reference to FIG. 1. FIG. 1 is a schematic view showing the arrangement of the exposure apparatus 100 according to the first embodiment. The exposure apparatus 100 can include, for example, an illumination optical system 10, a mask stage 2, a projection optical system 3, a substrate stage 5 (stage), imaging devices 6, a measurement device 7, a measurement device 9, and a processor 23. The processor 23 performs processing of determining the positions of marks 8 on a substrate based on a plurality of images obtained by the imaging devices 6, and controls each device of the exposure apparatus 100, which will be described later. In the exposure apparatus 100 according to the first embodiment, the processor 23 controls processing of exposing a substrate 4 (processing of forming a pattern on the substrate 4). However, the present invention is not limited to this, and a control device that controls the processing of exposing the substrate 4 may be provided separately from the processor 23. The substrate stage 5, the imaging devices 6, the measurement device 9, and the processor 23 can constitute a measurement apparatus that measures the position of a mark on a substrate stage (mark provided on a substrate or the substrate stage). The first embodiment will explain an example in which the positions of the marks 8 provided on a substrate are measured.

The illumination optical system 10 illuminates a mask 1 held by the mask stage 2 by using light (exposure light) emitted by a light source (not shown). The projection optical system 3 has a predetermined magnification (for example, ½), and projects, to the substrate 4, the pattern of the mask 1 illuminated with the exposure light. The mask 1 and the substrate 4 are held by the mask stage 2 and the substrate stage 5, respectively, and are disposed at optically almost conjugate positions (object plane and image plane of the projection optical system 3) through the projection optical system 3. The mask stage 2 holds the mask 1 by vacuum chuck, electrostatic chuck, or the like, and is constituted to be movable in, for example, directions (X and Y directions) parallel to the surface of the substrate 4 and rotation directions ($\theta X$, $\theta Y$, and $\theta Z$) around the X-, Y-, and Z-axes. The mask stage 2 can be driven by a mask driving device 2b. The substrate stage 5 holds the substrate 4 by vacuum chuck, electrostatic chuck, or the like, and is constituted to be movable in, for example, directions (X and Y directions) parallel to the surface of the substrate 4 and rotation directions ($\theta X$, $\theta Y$, and $\theta Z$) around the X-, Y-, and Z-axes. The substrate stage 5 can be driven by a driving device 5b. In the first embodiment, the driving device 5b can function as a driving device that changes the relative position between the substrate stage 5 and the imaging devices 6.

The measurement device 7 measures the position of the mask stage 2. The measurement device 7 can include, for example, an interferometer. The interferometer included in the measurement device 7 irradiates, with light, a mirror 2a provided on the side surface of the mask stage 2, and measures the position of the mask stage 2 from a reference position based on the light reflected by the mirror 2a.

Figure 2:
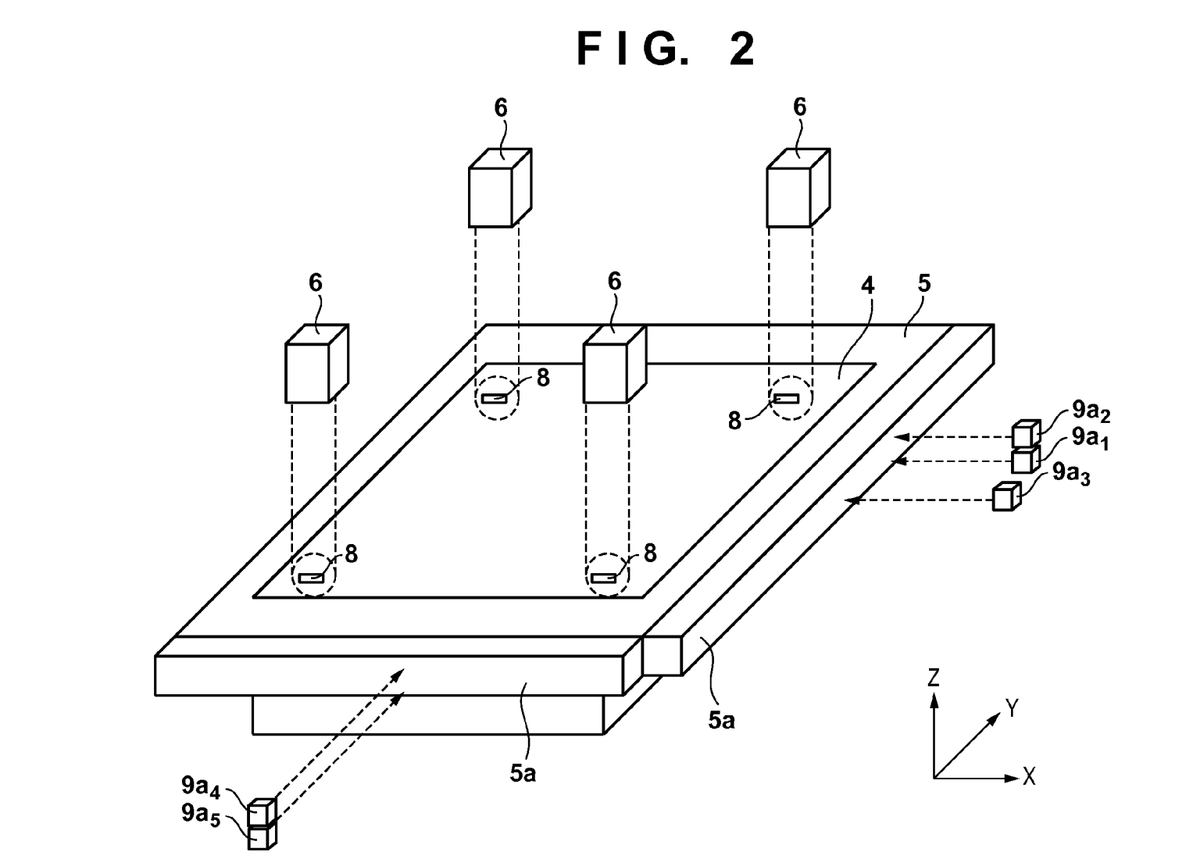
FIG. 2 is a view showing the positional relationship between a substrate stage, a measurement device, and imaging devices.

The measurement device 9 measures the position of the substrate stage 5 with reference to the imaging devices 6. The measurement device 9 can include, for example, a plurality of interferometers (first measurement devices 9a) each of which measures the position of the substrate stage 5. Each of the plurality of first measurement devices 9a irradiates, with light, a corresponding one of mirrors 5a provided on the side surfaces of the substrate stage 5, and measures the position of the substrate stage 5 from a reference position based on the light reflected by the mirror 5a. For example, the plurality of first measurement devices 9a are disposed as shown in FIG. 2. FIG. 2 is a view showing the positional relationship between the substrate stage 5, the measurement device 9 (plurality of first measurement devices 9a), and the imaging devices 6. Each of first measurement devices $9a_1$ to $9a_3$ measures the position of the substrate stage 5 in the X direction. The first measurement devices $9a_1$ and $9a_2$ are disposed side by side in the Z direction, and the first measurement devices $9a_1$ and $9a_3$ are disposed side by side in the Y direction. Each of the first measurement devices $9a_4$ and $9a_5$ measures the position of the substrate stage 5 in the Y direction. The first measurement devices $9a_4$ and $9a_5$ are disposed side by side in the Z direction. By disposing the respective first measurement devices 9a in this manner, the measurement device 9 can measure tilts ($\theta X$ and $\theta Y$) of the substrate stage and a rotation ($\theta Z$) of the substrate stage, in addition to the position of the substrate stage 5 in directions (X and Y directions) parallel to the surface of the substrate 4. The "position of the substrate stage" used in the following description can include at least one of a component regarding the position (X and Y directions) of the substrate stage 5 with respect to the imaging device 6, a component regarding the tilt of the substrate stage 5 with respect to the imaging device 6, and a component regarding the rotation of the substrate stage 5 with respect to the imaging device 6.

Figure 3:
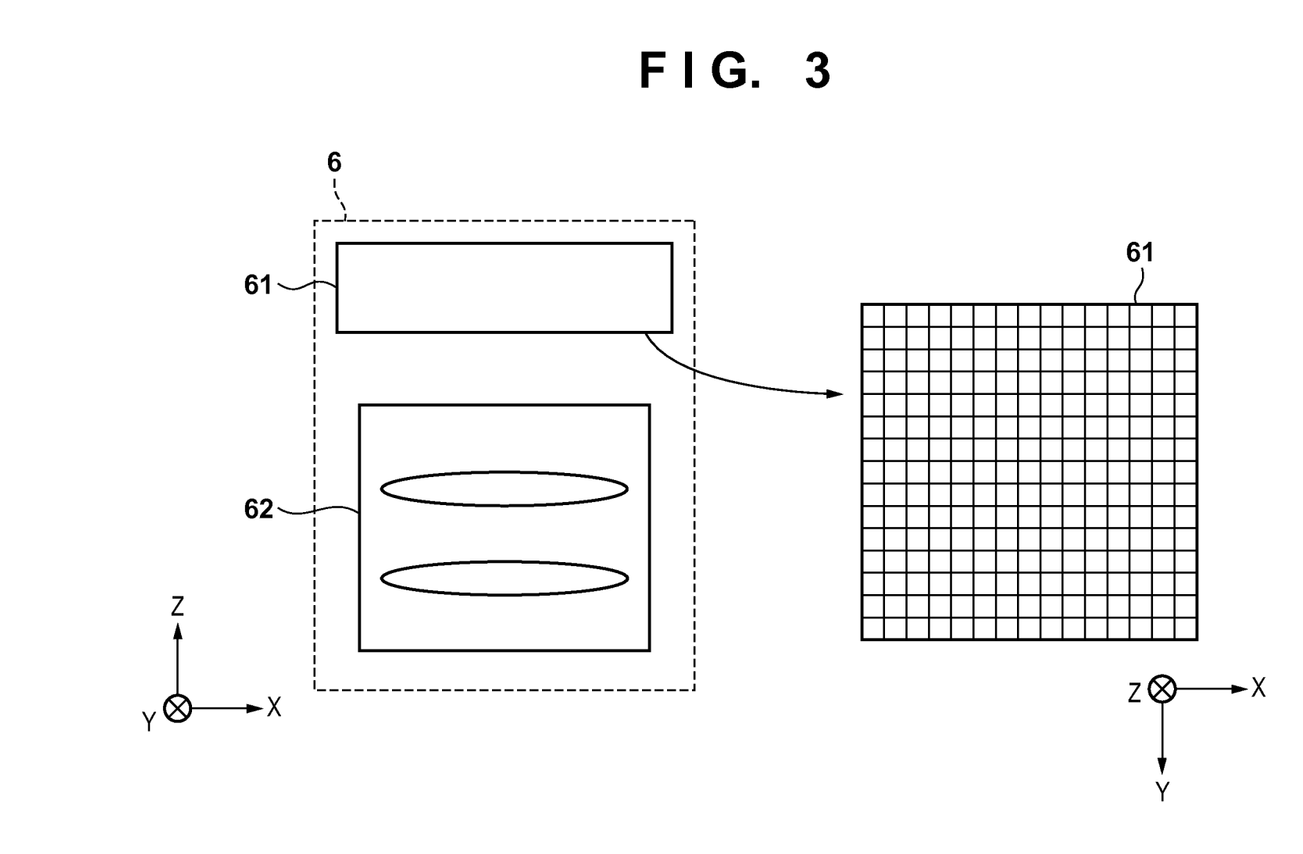
FIG. 3 is a schematic view showing the arrangement of the imaging device.

For example, as shown in FIG. 3, each imaging device 6 includes an image sensor 61 having a plurality of pixels, and an optical system 62 for projecting the mark 8 provided on the substrate to the image sensor 61. The imaging device 6 images the mark 8 provided on the substrate. As the image sensor 61, a sensor (for example, a CCD sensor or a CMOS sensor) in which a plurality of pixels are two-dimensionally arranged, or a sensor (for example, a line sensor) in which a plurality of pixels are one-dimensionally arranged can be used. The first embodiment will explain an example of using, as the image sensor 61, a sensor in which a plurality of pixels are two-dimensionally arranged. As shown in FIG. 2, the exposure apparatus 100 according to the first embodiment can include the plurality of imaging devices 6 so that the plurality of marks 8 provided on the substrate can be simultaneously imaged. As the imaging device 6, there are proposed an alignment scope 6a that images the mark 8 on the substrate through a mark on the mask and the projection optical system 3, and an off-axis scope 6b that images the mark 8 on the substrate without the intervention of the mark on the mask and the projection optical system 3. The first embodiment will explain an example in which a mark on a substrate is imaged by using the off-axis scope 6b as the imaging device 6.

[Method of Measuring Position of Mark on Substrate]

Figure 4A:
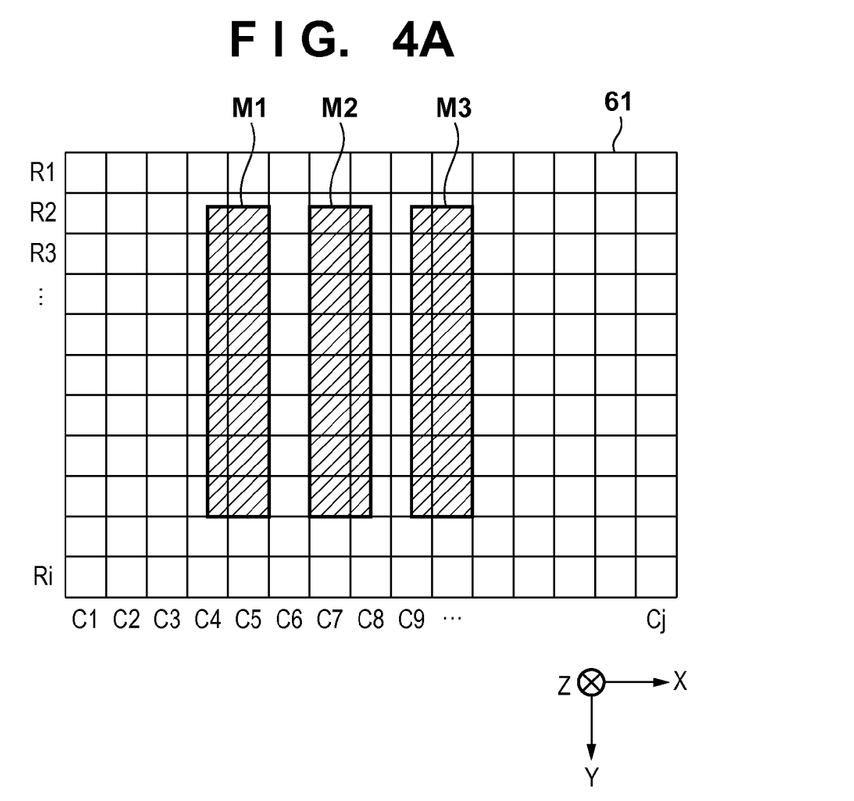
FIG. 4A is a view for explaining a method of measuring the position of a mark on a substrate.

A method of measuring the position of a mark based on an image obtained by imaging the mark on the substrate by the imaging device 6 will be described. FIG. 4A is a view showing a mark projected on the image sensor 61 of the imaging device 6. The image sensor 61 includes a plurality of two-dimensionally arranged pixels, as described above, and the plurality of pixels in FIG. 4A are arranged in rows R1 to Ri (i is the number of rows) and columns C1 to Cj (j is the number of columns). The mark 8 on the substrate includes, for example, an array (line & space pattern) of a plurality of patterns. Assume that three patterns included in the mark 8 on the substrate are projected on the image sensor shown in FIG. 4A at the optical magnification of the optical system 62 of the imaging device 6. In the following description, the three patterns projected on the image sensor 61 will be referred to as projection patterns M1 to M3. Assume that the pattern included in the mark 8 on the substrate is made of a low-light-reflectance member (for example, resist), and the remaining portion is made of a high-light-reflectance member (for example, glass). Note that it is only necessary that the light reflectance differs between the pattern on the substrate and the remaining portion. Thus, the pattern on the substrate may be made of a high-reflectance member, and the remaining portion may be made of a low-reflectance member.

Figure 4B:
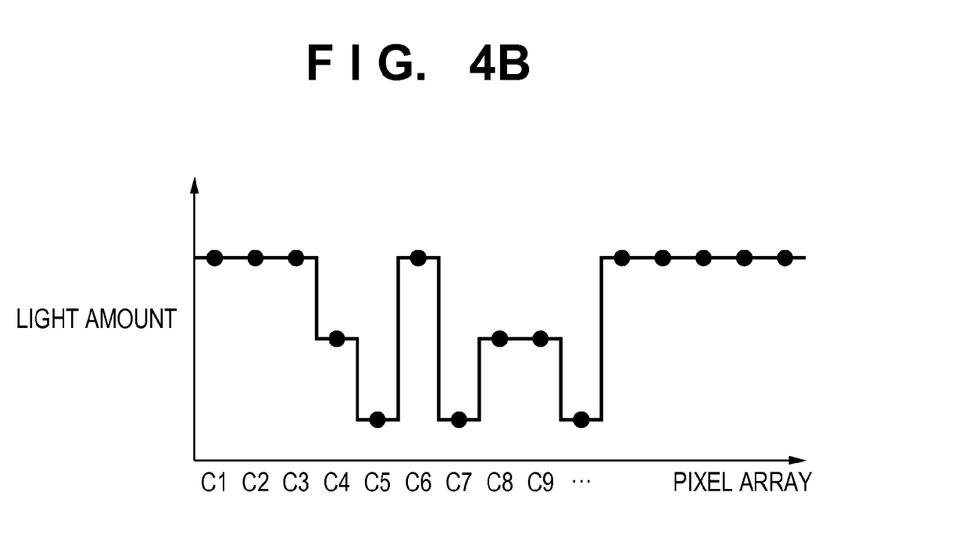
FIG. 4B is a graph for explaining the method of measuring the position of the mark on the substrate.

The imaging device 6 images the mark 8 on the substrate by using the image sensor 61, and outputs a signal obtained by sampling, at the pixel pitch, an image obtained by the imaging. FIG. 4B is a graph showing an example of a signal output from the imaging device 6. In FIG. 4B, the abscissa represents a pixel array or sequence (pixel row or column) in the image sensor 61, and the ordinate represents a light amount in each pixel array of the image sensor 61. Since the light reflectance differs between the line pattern on the substrate and the remaining portion, as described above, the light amount differs between a plurality of pixel arrays in accordance with an area by which the projection pattern is included. For example, on a pixel array C3 including none of the projection patterns M1 to M3, the light amount becomes larger than those on pixel arrays C4 and C5 including the projection pattern M1. On the pixel array C4, the light amount becomes larger than that on the pixel array C5 because the area by which the projection pattern is included is smaller. By using a signal output from the imaging device 6, the processor 23 can determine the position, on the substrate, of the mark 8 provided on the substrate. For example, the processor 23 can obtain the position of a mark on a substrate by using an edge detection method of detecting a change (edge) of the light amount of each pixel array, and obtaining the intersection point to obtain the center position of the projection pattern.

Figure 5A:
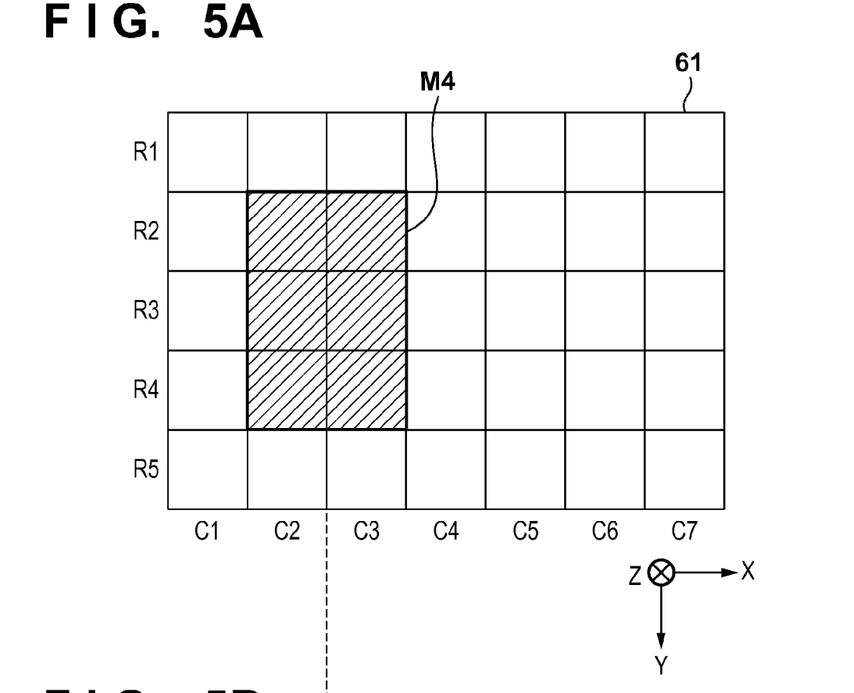
FIG. 5A is a view for explaining a sampling error generation principle.
Figure 5B:
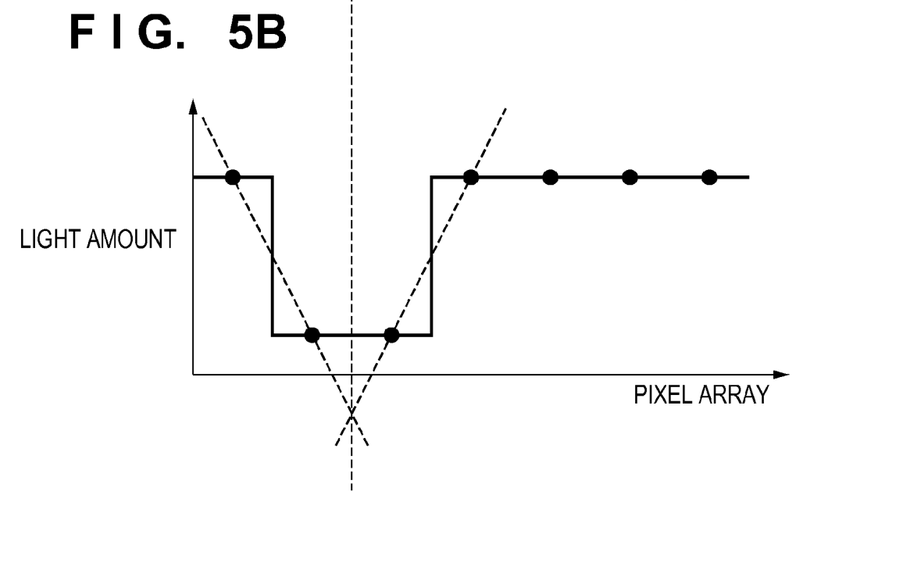
FIG. 5B is a graph for explaining the sampling error generation principle.

In the exposure apparatus 100 having this arrangement, an error arising from sampling (so-called sampling error) at the pixel pitch may be generated in the measurement result of the position of the mark 8. The generation principle of a sampling error in the measurement result of the position of a mark will be explained with reference to FIGS. 5A, 5B, 6A, and 6B. FIG. 5A is a view showing the image sensor 61 of the imaging device 6 on which the mark 8 on the substrate is projected. A case is assumed, in which a pattern (projection pattern M4) projected on the image sensor 61 corresponds with (corresponds to) two pixel arrays C2 and C3, as shown in FIG. 5A. In this case, the imaging device 6 images the mark on the substrate by using the image sensor 61, and outputs a signal (FIG. 5B) obtained by sampling, at the pixel pitch, an image obtained by the imaging. By using the signal output from the imaging device 6, the processor 23 detects the center position of the projection pattern M4 by the edge detection method. In this manner, when the projection pattern M4 corresponds with the pixel arrays, the center position of the projection pattern detected by the edge detection method can correspond with the center position of the actual projection pattern, as shown in FIGS. 5A and 5B.

Figure 6A:
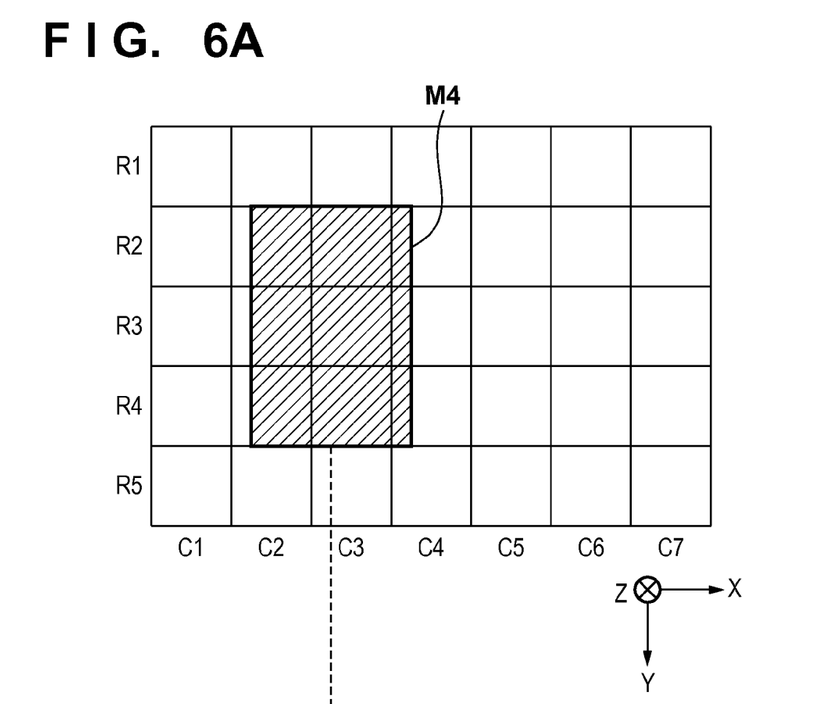
FIG. 6A is a graph for explaining the sampling error generation principle.
Figure 6B:
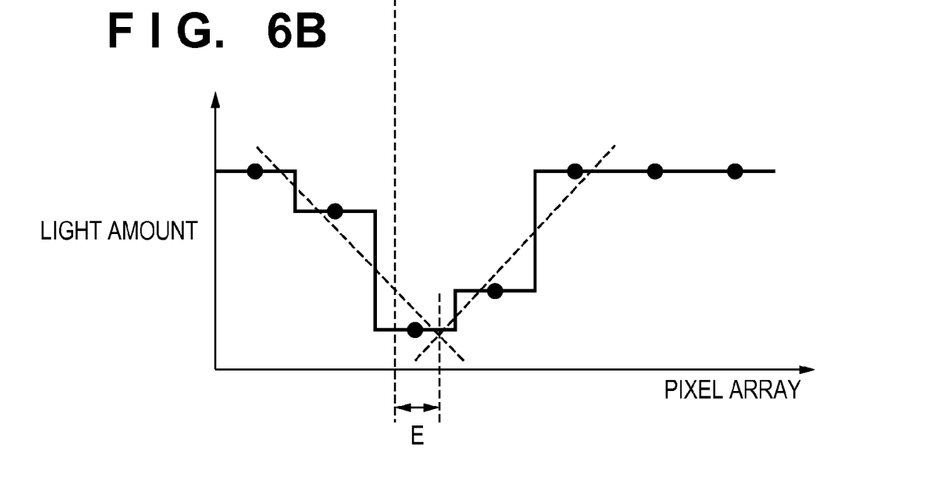
FIG. 6B is a graph for explaining the sampling error generation principle.

In contrast, a case is assumed, in which the projection pattern M4 is shifted by ¼ of the pixel pitch from the position shown in FIG. 5A, that is, the projection pattern M4 does not correspond with the pixel arrays, as shown in FIG. 6A. In this case, the imaging device 6 images the mark 8 on the substrate by using the image sensor 61, and outputs a signal (FIG. 6B) obtained by sampling, at the pixel pitch, an image obtained by the imaging. By using the signal output from the imaging device 6, the processor 23 detects the center position of the projection pattern M4 by the edge detection method. When the projection pattern M4 does not correspond with the pixel arrays, a difference E may be generated between the center position of the projection pattern detected by the edge detection method and the center position of the actual projection pattern, as shown in FIGS. 6A and 6B. The difference E is a sampling error and degrades the measurement accuracy of the mark 8 on the substrate.

Figure 7:
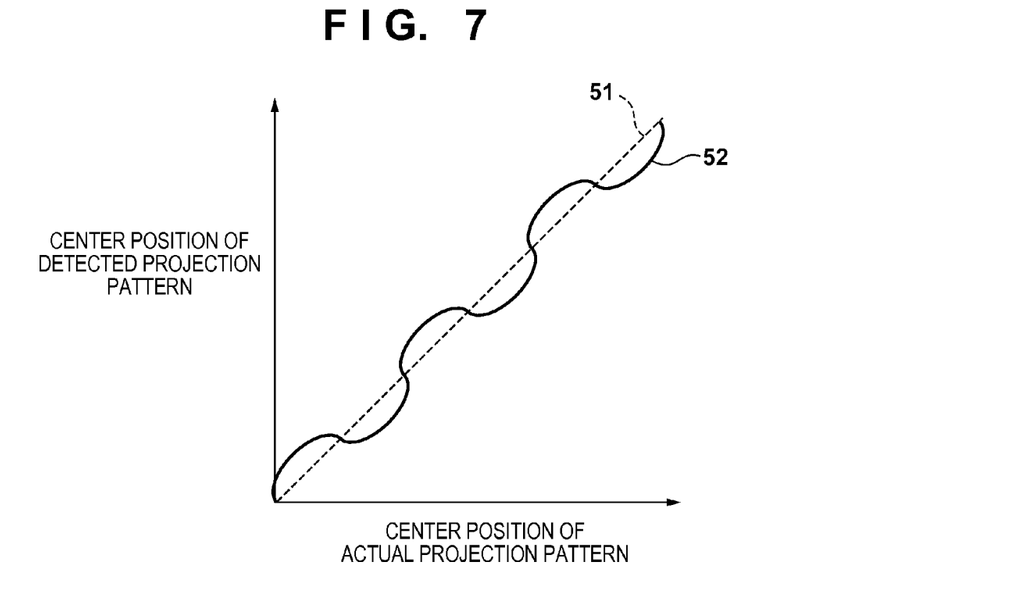
FIG. 7 is a graph showing the relationship between the center position of a projection pattern detected by an edge detection method and the center position of an actual projection pattern.

FIG. 7 is a graph showing the relationship between the center position of a projection pattern detected by the edge detection method and the center position of an actual projection pattern. Ideally, the center position of the projection pattern detected by the edge detection method and the center position of the actual projection pattern may have the same value, as indicated by a broken line 51 in FIG. 7. However, if the projection pattern is shifted from pixel arrays, a sampling error is generated in a given period between the center position of the projection pattern detected by the edge detection method and the center position of the actual projection pattern, as indicated by a solid line 52 in FIG. 7. The period of this sampling error is known to be equal to the pixel pitch. Theoretically, the sampling error can be canceled (reduced) by determining the position of a mark on a substrate by using n images in which the positions of projection patterns on the image sensor are different from each other by 1/n (n≥2) of the pixel pitch.

Figure 8:
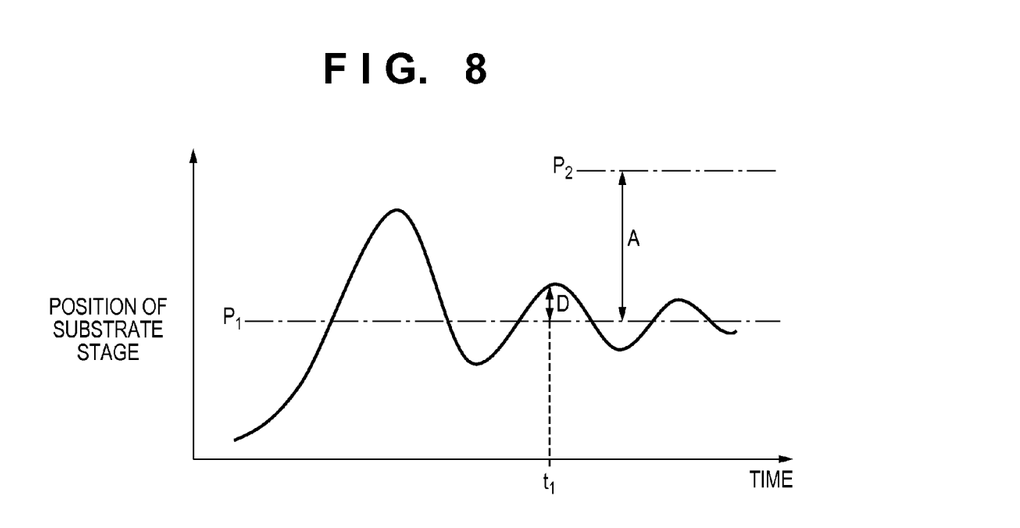
FIG. 8 is a graph showing the relationship between the position of the substrate stage and the time.

As a method of changing the position of the projection pattern on the image sensor, the target position of the substrate stage 5 (target relative position between the substrate stage 5 and the imaging device 6) is changed. For example, when changing the position of a projection pattern on the image sensor by 1/n of the pixel pitch, the target position of the substrate stage 5 is changed by an amount obtained from 1/n of the pixel pitch and the optical magnification of the optical system 62 of the imaging device 6. However, the position of the substrate stage 5 upon obtaining an image by the imaging device 6 does not always correspond with the target position owing to the vibration of the substrate stage 5 and the like. That is, the position of the substrate stage 5 upon obtaining an image by the imaging device 6 may deviate from the target position. For example, a case is assumed, in which the imaging device 6 successively obtains two images (first and second images) out of the n images. FIG. 8 is a graph showing the relationship between the position of the substrate stage 5 and the time. A case is assumed, in which the position of the substrate stage 5 at time $t_1$ when the mark 8 on the substrate was imaged to obtain the first image is different from a first target position $P_1$, that is, a deviation D is generated between the position of the substrate stage 5 at time $t_1$ and the first target position $P_1$, as shown in FIG. 8. In this case, the target position (second target position $P_2$) of the substrate stage for acquiring the second image is determined to be changed from the first target position $P_1$ by a target distance A obtained from the pixel pitch and the optical magnification of the optical system 62. If the second target position $P_2$ is determined in this fashion, the distance between the position of the substrate stage 5 at time $t_1$ when the first image was obtained, and the second target position $P_2$ differs from the target distance A by the deviation D. As a result, the difference of the position of the projection pattern between the first and second images is shifted from 1/n of the pixel pitch, and reduction of the sampling error may become insufficient.

To solve this, the exposure apparatus 100 according to the first embodiment determines the target position (second target position $P_2$) of the substrate stage 5 when obtaining the second image by the imaging device 6, in consideration of the position of the substrate stage 5 that was measured by the measurement device 9 upon obtaining the first image by the imaging device 6. That is, the exposure apparatus 100 determines respective target relative positions so that a plurality of relative positions between the substrate stage 5 and the imaging devices 6 become different by 1/n of the pixel pitch as relative positions between the imaging devices 6 and imaged marks (images of marks on the substrate). For example, the processor 23 determines the second target position $P_2$ of the substrate stage 5 for obtaining the second image by the imaging device 6, so that a length on the image sensor, which corresponds to the distance between the second target position $P_2$ and the position of the substrate stage 5 upon obtaining the first image, becomes 1/n of the pixel pitch. The difference of the position of the projection pattern between the first and second images can come close to 1/n of the pixel pitch, compared to a case in which the second target position $P_2$ is determined based on the first target position $P_1$. When the mark 8 on the substrate includes an array of a plurality of patterns, the processor 23 desirably moves the substrate stage 5 in the direction of the array of the plurality of patterns when obtaining n images by the imaging device 6.

[Measurement Sequence of Position of Mark on Substrate]

Figure 9:
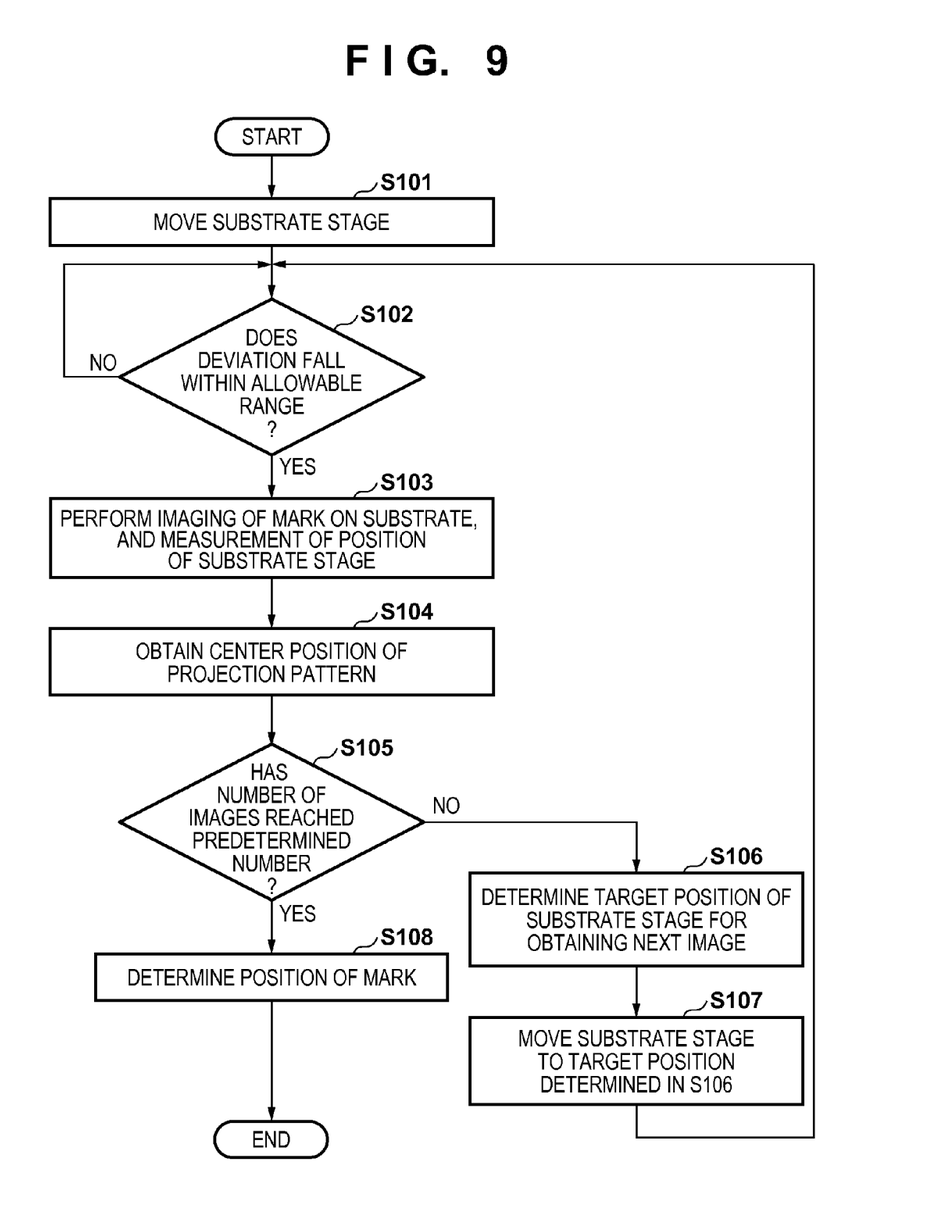
FIG. 9 is a flowchart showing a method of measuring the position of a mark on a substrate from n images.
Figure 10:
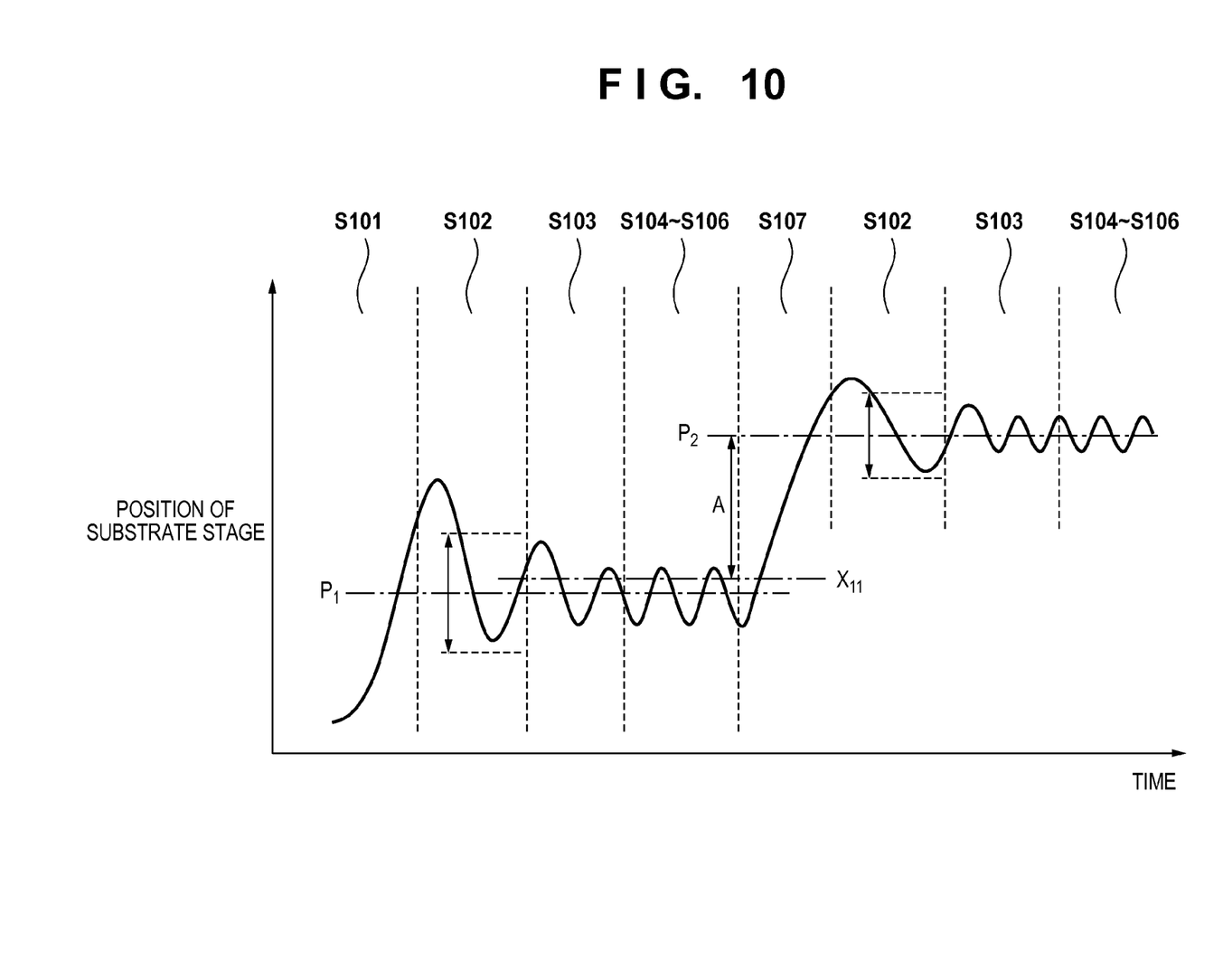
FIG. 10 is a graph showing the relationship between the position of the substrate stage and the time.

Next, a sequence to measure the position of a mark on a substrate from n images obtained by the imaging device 6 will be explained with reference to FIGS. 9 and 10. FIG. 9 is a flowchart showing a method of acquiring n images by the imaging device 6, and measuring the position of a mark on a substrate from the n images. FIG. 10 is a graph showing the relationship between the position of the substrate stage 5 and the time when obtaining two images (for example, the first and second images). S101 to S109 shown in FIG. 10 correspond to respective steps in FIG. 9.

In step S101, the processor 23 moves the substrate stage 5 so that the mark 8 on the substrate enters the field of view of the imaging device 6. In step S102, the processor 23 moves the substrate stage 5, and determines whether the deviation between the target position and the position of the substrate stage 5 that was measured by the measurement device 9 falls within an allowable range. If the deviation falls within the allowable range, the process advances to step S103. If the deviation does not fall within the allowable range, step S102 is repeated. If the amplitude of the vibration of the substrate stage 5 during imaging of the mark 8 on the substrate is larger than the interval between the line patterns of the mark 8, adjacent projection patterns overlap each other, and it may become difficult to obtain the center position of each projection pattern with high accuracy. Therefore, the allowable range may be set to be equal to or narrower than the interval between the patterns of the mark 8 on the substrate. The substrate stage 5 may vibrate even during imaging of the mark 8 on the substrate in order to obtain the second image. Thus, an allowable range when obtaining the second image may be set to be narrower than an allowable range when obtaining the first image. By narrowing the allowable range, the difference of the position of the projection pattern between the first and second images can further come close to 1/n of the pixel pitch. An allowable range when obtaining the third and subsequent images is desirably set to be equal to or narrower than the allowable range when obtaining the second image.

In step S103, the processor 23 causes the imaging device 6 to image the mark 8 on the substrate, and causes the measurement device 9 to measure the position of the substrate stage 5 in the period in which imaging by the imaging device 6 is performed. Accordingly, the imaging device 6 can obtain one image, and the processor 23 can obtain, from the imaging device 6, a signal acquired by sampling this image at the pixel pitch. The processor 23 stores the position of the substrate stage 5 that was measured by the measurement device 9 in that period. In the first embodiment, the processor 23 starts imaging of the mark on the substrate by the imaging device 6 when the deviation falls within the allowable range. However, the present invention is not limited to this. For example, the processor 23 may obtain in advance the time (settling time) in which the vibration of the substrate stage 5 is settled, and after the settling time elapses, start imaging by the imaging device 6. In step S103, the processor 23 stores the position of the substrate stage 5 that was measured by the measurement device 9 in the period in which imaging by the imaging device 6 was performed. However, the deviation between the target position and the position of the substrate stage 5 that was measured by the measurement device in that period may also be stored.

In step S104, the processor 23 obtains the center position of the projection pattern on the image sensor by the above-described method based on one image obtained by the imaging device 6, that is, the signal obtained from the imaging device 6. In step S105, the processor 23 determines whether the number of images obtained by the imaging device 6 has reached a predetermined number (for example, n). If the number of images has not reached the predetermined number, the process advances to step S106. If the number of images has reached the predetermined number, the process advances to step S108.

In step S106, by using the position of the substrate stage 5 that has been stored in step S103, the processor 23 determines the target position of the substrate stage 5 for obtaining the next image by the imaging device 6. For example, the processor 23 determines the target position of the substrate stage 5 for obtaining the next image by the imaging device 6, so that a length on the image sensor, which corresponds to the distance between the target position and the position of the substrate stage 5 that has been stored in step S103, becomes 1/n of the pixel pitch. Here, when the deviation between the position of the substrate stage 5 and the target position is stored in step S103, the processor 23 may determine the target position of the substrate stage 5 for obtaining the next image by using the deviation. When the position (or deviation) of the substrate stage 5 in the period in which imaging by the imaging device 6 is performed is stored, the target position of the substrate stage 5 for obtaining the next image may be determined by using the average value of positions (or deviations) of the substrate stage 5 in this period. For example, assume that the average value of positions of the substrate stage 5 in the period (step S103) in which the imaging device 6 obtains the first image is $X_{11}$ in FIG. 10. In this case, the processor 23 determines, as the target position $P_2$ of the substrate stage for obtaining the next image (second image), a position obtained by adding, to the average value $X_{11}$, the target distance A of the substrate stage 5 that corresponds to 1/n of the pixel pitch in the image sensor 61.

In step S107, the processor 23 moves the substrate stage 5 to the target position determined in step S106. After that, the processor 23 repeats steps S102 to S105. In step S108, the processor 23 determines the position of the mark 8 on the substrate by using the center position of the projection pattern that has been obtained in step S104. By controlling the movement of the substrate stage 5 and acquiring n images in this way, the processor 23 can reduce the sampling error and determine the position of the mark 8 on the substrate with high accuracy. Although the position of the mark 8 on the substrate is determined based on n images in the first embodiment, it may be determined based on a plurality of images including n images.

As described above, the exposure apparatus 100 according to the first embodiment determines the target position of the substrate stage 5 for obtaining the next image by the imaging device 6, in consideration of the position of the substrate stage 5 upon obtaining an image by the imaging device 6. As a result, the amount by which the position of the projection pattern on the image sensor is changed by moving the substrate stage 5 can come close to 1/n of the pixel pitch. The sampling error can be reduced, and the position of the mark on the substrate can be determined with high accuracy.

The exposure apparatus according to the first embodiment determines, from the position (or deviation) of the substrate stage 5 at the time of immediately preceding imaging, the target position of the substrate stage 5 for obtaining an image by the imaging device 6. However, the present invention is not limited to this. The target position may be determined by using the position of the substrate stage 5 at the time of the second or more preceding imaging, or by using a plurality of positions of the substrate stage 5 at the time of past imaging. In the latter case, for example, the target position can be determined based on the position of the substrate stage 5 at the time of immediately preceding imaging, and the position of the substrate stage 5 at the time of second preceding imaging. At this time, when the signs (+/−) of two past deviations are different, the target position of the substrate stage 5 for obtaining an image by the imaging device 6 may be determined to be a preset value.

The exposure apparatus according to the first embodiment moves the substrate stage 5 to acquire n images in which positions of the projection pattern are different from each other. However, the present invention is not limited to this. For example, a driving device that drives the imaging device 6 may be provided to move the imaging device 6 and acquire n images. Alternatively, both the substrate stage 5 and the imaging device 6 may be moved to acquire n images. In this case, at least one of the driving device 5b that drives the substrate stage 5, and the driving device that drives the imaging device 6 can function as a driving device that changes the relative position between the substrate stage 5 and the imaging device 6.

Second Embodiment

Figure 11:
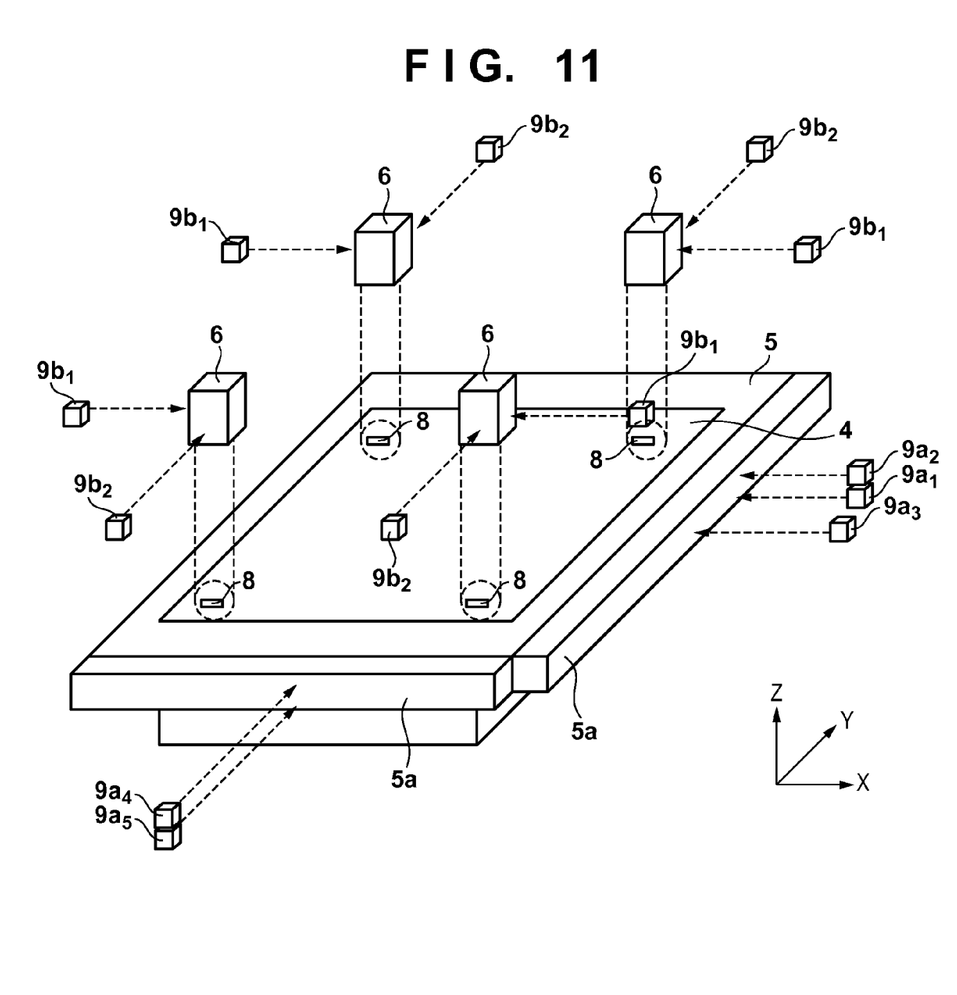
FIG. 11 is a view showing the positional relationship between the substrate stage, the measurement device, and the imaging devices.

An exposure apparatus according to the second embodiment of the present invention will be explained. In the exposure apparatus, not only a substrate stage 5 vibrates owing to disturbance, but also imaging devices 6 may vibrate. Only by measuring the position of the substrate stage 5, the position of the substrate stage 5 with reference to the imaging devices 6 cannot be satisfactorily measured with high accuracy. In the exposure apparatus according to the second embodiment, therefore, a measurement device 9 can include a plurality of interferometers (second measurement devices 9b) that measure the positions of the respective imaging devices 6, as shown in FIG. 11. FIG. 11 is a view showing the positional relationship between the substrate stage 5, the measurement device 9 (a plurality of first measurement devices 9a and the plurality of second measurement devices 9b), and the imaging devices 6. In the exposure apparatus, the plurality of second measurement devices 9b may be provided for the respective imaging devices 6 so that the positions of the respective imaging devices 6 in the X and Y directions can be measured. For example, a second measurement device $9b_1$ provided for each imaging device 6 is disposed to measure the position of the imaging device 6 in the X direction, and a second measurement device $9b_2$ is disposed to measure the position of the imaging device 6 in the Y direction. Each second measurement device 9b may be supported by a support member that supports each first measurement device 9a for measuring the position of the substrate stage 5. Hence, the measurement device 9 can measure the position of the substrate stage 5 with respect to the imaging device 6 with high accuracy. In the exposure apparatus according to the second embodiment, the arrangement except for the measurement device 9 is the same as that in the exposure apparatus 100 according to the first embodiment, and a description of the arrangement except for the second measurement device will not be repeated.

Next, a method of measuring the position of a mark 8 on a substrate by using n images will be described. The exposure apparatus according to the second embodiment measures the position of the mark 8 on the substrate according to the flowchart shown in FIG. 9. The exposure apparatus according to the second embodiment is different in step S103 from the exposure apparatus 100 according to the first embodiment. Step S103 will be explained below. In step S103, a processor 23 causes the imaging device 6 to image the mark 8 on the substrate, and causes the measurement device 9 to measure the position of the substrate stage 5 with respect to the imaging device 6 in the period in which imaging by the imaging device 6 is performed. At this time, the measurement device 9 obtains the position of the substrate stage 5 with respect to the imaging device 6 (the relative position between the substrate stage 5 and the imaging device 6) based on the result of measurement by each first measurement device 9a and the result of measurement by each second measurement device 9b, as described above. The processor 23 stores the position of the substrate stage 5 with respect to the imaging device 6 that was measured by the measurement device 9 in that period. Here, the processor 23 stores the position of the substrate stage that was measured by the measurement device 9 in the period in which imaging by the imaging device 6 was performed. Alternatively, the deviation between the target position and the position of the substrate stage 5 that was measured by the measurement device 9 in that period may be stored.

As described above, in the exposure apparatus according to the second embodiment, the measurement device 9 uses the first measurement device 9a to measure the position of the substrate stage 5, and uses the second measurement device 9b to measure the position of the imaging device 6. The exposure apparatus according to the second embodiment can therefore measure the position of the substrate stage 5 with respect to the imaging device 6 with higher accuracy than in the exposure apparatus 100 according to the first embodiment.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a substrate (a step of exposing the substrate) using the above-described lithography apparatus (exposure apparatus), and a step of processing the substrate onto which the pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, quality, productivity, and production cost of the article, as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-130687 filed Jun. 25, 2014, which is hereby incorporated by reference herein in its entirety.

What is claimed is:

1. A measurement apparatus that includes a movable stage and measures a position of a mark moved with the stage, the apparatus comprising:
an imaging device including a plurality of pixels arranged at a pitch and configured to image the mark via the plurality of pixels;
a driving device configured to change a relative position between the stage and the imaging device;
a measurement device configured to measure the relative position; and
a processor configured to obtain the position of the mark based on a plurality of images respectively obtained by the imaging device at a plurality of relative positions between the stage and the imaging device that are different from each other and associated with the pitch,
wherein the processor is configured to obtain, based on a deviation between a measured relative position where the mark has been imaged by the imaging device and a first target relative position with respect to one of the plurality of relative positions, a second target relative position where the mark is to be imaged by the imaging device with respect to another of the plurality of relative positions.

2. The apparatus according to claim 1, wherein
a number of the plurality of relative positions is n, and
the processor is configured to obtain the second target relative position so as to make each adjacent ones of the plurality of relative positions different from each other by 1/n of the pitch as relative positions between the imaging device and the image of the mark.

3. The apparatus according to claim 1, wherein the processor is configured to obtain, based on a deviation of a position of the stage, where a first image has been obtained by the imaging device, from a target position of the stage corresponding thereto, a target position of the stage where a second image is to be obtained by the imaging device.

4. The apparatus according to claim 3, wherein the processor is configured to obtain the target position where the second image is to be obtained by the imaging device, based on an average of deviations of positions of the stage from the target position of the stage corresponding thereto in a period in which the first image has been obtained.

5. The apparatus according to claim 1, wherein the measurement device includes a first measurement device configured to measure a position of the stage, and a second measurement device configured to measure a position of the imaging device, and is configured to measure the relative position based on measurement by the first measurement device and measurement by the second measurement device.

6. The apparatus according to claim 1, wherein
the mark includes an array of a plurality of patterns, and
the processor is configured to obtain the second target relative position in a direction of the array.

7. The apparatus according to claim 1, wherein the relative position includes a component associated with rotation of the stage.

8. The apparatus according to claim 1, wherein the processor is configured to cause the imaging device to image the mark if the deviation falls within a tolerance.

9. The apparatus according to claim 1, wherein the processor is configured to obtain, based on the deviation, the second target relative position so as to differ from the measured relative position by a distance associated with the pitch.

10. The apparatus according to claim 1, wherein
a number of the plurality of relative positions is n, and
the processor is configured to obtain the second target relative position such that a distance between the measured relative position and the second target relative position corresponds to 1/n of the pitch.

11. A lithography apparatus that performs patterning on a substrate, the lithography apparatus comprising:
a measurement apparatus including a movable stage and configured to measure a position of a mark formed on a substrate held by the stage; and
a device configured to form a pattern to perform the patterning on the substrate,
wherein the measurement apparatus includes:
an imaging device including a plurality of pixels arranged at a pitch and configured to image the mark via the plurality of pixels;
a driving device configured to change a relative position between the stage and the imaging device;
a measurement device configured to measure the relative position; and
a processor configured to obtain the position of the mark based on a plurality of images respectively obtained by the imaging device at a plurality of relative positions between the stage and the imaging device that are different from each other and associated with the pitch,
wherein the processor is configured to obtain, based on a deviation between a measured relative position where the mark has been imaged by the imaging device and a first target relative position with respect to one of the plurality of relative positions, a second target relative position where the mark is to be imaged by the imaging device with respect to another of the plurality of relative positions.

12. A method of manufacturing an article, the method comprising steps of:
performing patterning on a substrate using a lithography apparatus; and
processing the substrate, on which the patterning has been performed, to manufacture the article,
wherein the lithography apparatus performs the patterning on the substrate, and includes:
a measurement apparatus configured to measure a position of a mark formed on the substrate; and
a device configured to form a pattern to perform the patterning on the substrate,
wherein the measurement apparatus includes a movable stage and measures the position of the mark formed on the substrate held by the stage, and includes:
an imaging device including a plurality of pixels arranged at a pitch and configured to image the mark via the plurality of pixels;
a driving device configured to change a relative position between the stage and the imaging device;
a measurement device configured to measure the relative position; and
a processor configured to obtain the position of the mark based on a plurality of images respectively obtained by the imaging device at a plurality of relative positions between the stage and the imaging device that are different from each other and associated with the pitch,
wherein the processor is configured to obtain, based on a deviation between a measured relative position where the mark has been imaged by the imaging device and a first target relative position with respect to one of the plurality of relative positions, a second target relative position where the mark is to be imaged by the imaging device with respect to another of the plurality of relative positions.

* * * * *